US008766435B2

(12) United States Patent
Hundt et al.

(10) Patent No.: US 8,766,435 B2
(45) Date of Patent: Jul. 1, 2014

(54) INTEGRATED CIRCUIT PACKAGE INCLUDING EMBEDDED THIN-FILM BATTERY

(75) Inventors: Michael J. Hundt, Denton, TX (US); Haibin Du, Denton, TX (US); Krishnan Kelappan, Denton, TX (US); Frank Sigmund, Denton, TX (US)

(73) Assignee: STMicroelectronics, Inc., Coppell, TX (US)

( * ) Notice: Subject to any disclaimer, the term of this patent is extended or adjusted under 35 U.S.C. 154(b) by 1488 days.

(21) Appl. No.: 10/880,757

(22) Filed: Jun. 30, 2004

(65) Prior Publication Data
US 2006/0001137 A1 Jan. 5, 2006

(51) Int. Cl.
| | |
|---|---|
| H01L 23/48 | (2006.01) |
| H01L 23/58 | (2006.01) |
| H01M 6/18 | (2006.01) |
| H01M 2/10 | (2006.01) |
| H01M 6/40 | (2006.01) |

(52) U.S. Cl.
USPC .... 257/724; 257/666; 257/787; 257/E23.058; 429/322; 429/127; 365/228; 365/229

(58) Field of Classification Search
USPC ........... 257/738, 678, 777, 74, 691, E23.037, 257/E23.043, E23.047, E23.058; 361/728; 429/322, 127
See application file for complete search history.

(56) References Cited

U.S. PATENT DOCUMENTS

| | | | | | |
|---|---|---|---|---|---|
| 3,986,334 | A | * | 10/1976 | Harper | 368/83 |
| 4,391,531 | A | * | 7/1983 | Yokota et al. | 368/239 |
| 4,872,844 | A | * | 10/1989 | Grebe et al. | 439/69 |
| 5,008,776 | A | * | 4/1991 | Queyssac | 361/728 |
| 5,338,625 | A | * | 8/1994 | Bates et al. | 429/322 |
| 5,561,004 | A | * | 10/1996 | Bates et al. | 429/162 |
| 6,805,998 | B2 | * | 10/2004 | Jenson et al. | 429/162 |
| 2001/0028554 | A1 | * | 10/2001 | Guillot et al. | 361/728 |
| 2002/0001746 | A1 | * | 1/2002 | Jenson | 429/162 |
| 2002/0109237 | A1 | * | 8/2002 | Oka | 257/777 |
| 2003/0146507 | A1 | * | 8/2003 | Zhou et al. | 257/738 |
| 2008/0003492 | A1 | * | 1/2008 | Bates | 429/66 |
| 2008/0032200 | A1 | * | 2/2008 | Bates | 429/322 |

OTHER PUBLICATIONS

"Thin-Film Rechargeable Lithium, Lithium-Ion, and Li-free Batteries," http://www.ssd.ornl.gov/Programs/BatteryWeb/index.htm, Oct. 29, 2001, 1 page.
"Thin-Film Battery Features," http://www.ssd.oml.gov/Programs/BatteryWeb/Features.html, Oct. 29, 2001, 1 page.
"Thin-Film Battery Applications," http://www.ssd.ornl.gov/Programs/BatteryWeb/Applications.html, Oct. 29, 2001, 2 pages.
"Thin-Film Battery Design," http://www.ssd.ornl.gov/Programs/BatteryWeb/Layout.html, Oct. 29, 2001, 1 page.

(Continued)

Primary Examiner — Zandra Smith
Assistant Examiner — Tsz Chiu
(74) Attorney, Agent, or Firm — Munck Wilson Mandala, LLP

(57) ABSTRACT

An integrated circuit package is provided with a thin-film battery electrically connected to and encapsulated with an integrated circuit die. The battery can be fabricated on a dedicated substrate, on the die pad, or on the integrated circuit die itself.

24 Claims, 7 Drawing Sheets

(56) References Cited

OTHER PUBLICATIONS

"Thin-Film Battery Cross Sections," http://www.ssd.ornl.gov/Programs/BatteryWeb/CrossSection.html, Oct. 29, 2001, 2 pages.
"Thin-Film Battery Properties and Performance," http://www.ssd.ornl.gov/Programs/BatteryWeb/Properties.html, Oct. 29, 2001, 1 page.
"Comparisons of Several Thin-Film Lithium Batteries," http://www.ssd.ornl.gov/Programs/BatteryWeb/Comparisons.html, Oct. 29, 2001, 3 pages.
"Lithium Batteries with Crystalline LiCoO2 Cathodes," http://www.ssd.ornl.gov/Programs/BattelyWeb/cLiCoO2.html, Mar. 17, 2000, 2 pages.
"Batteries with Nanocrystalline LixMn2-yO4 Cathodes," http://www.ssd.ornl.gov/Programs/BatteryWeb/aLiMn2O4.html, Mar. 21, 2000, 2 pages.
"Batteries with Crystalline LiMn2O4 Cathodes," http://www.ssd.ornl.gov/Programs/BatteryWeb/Climn2o4.html, Mar. 21, 2000, 1 page.
"Thin Film Lithium-Ion Batteries," http://www.ssd.ornl.gov/Programs/BatteryWeb/Lithium-ion.html, Mar. 21, 2000, 4 pages.
"Lithium-free" Thin Film Batteries, http://www.ssd.ornl.gov/Programs/BatteryWeb/lifree.html, Mar. 21, 2000, 2 pages.
"Lithium Phosphorus Oxynitride ("Lipon") Electrolyte," http://www.ssd.ornl.gov/Programs/BatteryWeb/Lipon.html, Mar. 23, 2000, 2 pages.
"Thin-Film Battery References," http://www.ssd.ornl.gov/Programs/BatteryWeb/References.html, Oct. 29, 2001, 2 pages.
"Thin-Film Battery Fabrication Steps," http://www.ssd.ornl.gov/Programs/BatteryWeb/PlanView.html, Mar. 23, 2000, 2 pages.

\* cited by examiner

US 8,766,435 B2

INTEGRATED CIRCUIT PACKAGE INCLUDING EMBEDDED THIN-FILM BATTERY

FIELD OF THE INVENTION

The invention relates generally to thin-film batteries and, more particularly, to the use of thin-film batteries in conjunction with integrated circuit packages.

BACKGROUND OF THE INVENTION

Thin-film, solid state, rechargeable lithium, lithium-ion and lithium-free batteries can be produced with a thickness of less than 15 micrometers. Such batteries have high energy and power densities, can be cycled thousands of times, and can be fabricated in arbitrary shapes and to any required sizes. These batteries can be fabricated on any solid substrate such as silicon, alumina, glass and plastics. They can also be fabricated on flexible substrates such as flexible plastics and thin metal foils.

FIG. 1 is a generalized top view of a thin-film battery provided on a substrate 11 according to the prior art.

FIG. 2 is a cross sectional view taken along line 2-2 of FIG. 1. In the examples of FIGS. 1 and 2, the thin-film battery is a lithium-ion battery having an exposed conductive pad 13 for providing electrical connectivity to the cathode, and a further exposed conductive pad 15 for providing electrical connectivity to the lithium-ion anode.

Thin-film batteries have a wide range of uses as active or standby power sources for consumer products such as non-volatile memories, smart cards, sensors, radio frequency identification tags, micro-sized devices, implantable medical devices, miniature transmitters, MEMS devices and PCM-CIA cards. In prior art applications, thin-film batteries have been integrated with multi-chip modules by fabricating the thin-film battery onto the backside of the multi-chip module's ceramic package. The battery is connected to the multi-chip circuitry on the front side of the package by depositing the cathode and anode current collectors of the battery over conductive through-holes.

Thin-film lithium-ion and lithium-free batteries, when not charged, are not adversely affected by heating to 250 degrees centigrade for 10 minutes. Many integrated circuits are assembled by the solder reflow or surface mount process in which all the electronic components are soldered on the board at the same time by heating to temperatures as high as 250 degrees centigrade for several minutes. Uncharged lithium-ion and lithium-free batteries can survive this assembly process, and can therefore be present on the board during the process.

It is desirable in view of the foregoing to provide further applications for thin-film batteries.

According to exemplary embodiments of the invention, an integrated circuit package has encapsulated therein an integrated circuit die and a thin-film battery electrically connected to the integrated circuit die.

DETAILED DESCRIPTION OF THE INVENTION

The present invention recognizes that the thin profile of thin-film batteries in general, and the heat tolerance of lithium-ion and lithium-free thin-film batteries can be utilized to produce an integrated circuit package including an integrated circuit die encapsulated with and electrically connected to a thin-film battery. As used hereinafter, the term "battery" should be understood to refer to a thin-film battery.

According to exemplary embodiments of the invention, a battery can be electrically connected to and encapsulated together with an integrated circuit die in an integrated circuit package, for example, a lead-frame plastic package. In some embodiments, the battery can be fabricated onto an FR-4 (or BT) substrate, for example 0.56 millimeters thick. The cathode and anode current collectors of the battery are routed out to expose electrically conductive pads (for example, gold plated pads) on the substrate. The substrate can then be glued to the bottom of a lead-frame die pad using an adhesive epoxy. From this point, generally conventional integrated circuit packaging procedures are performed, including attaching the integrated circuit die to the lead-frame die pad, wire bonding the integrated circuit die to leads of the lead-frame and to the battery cathode and anode current collectors via the electrically conductive pads on the substrate, encapsulating the integrated circuit package using a suitable encapsulant material, etc.

Figure 3:
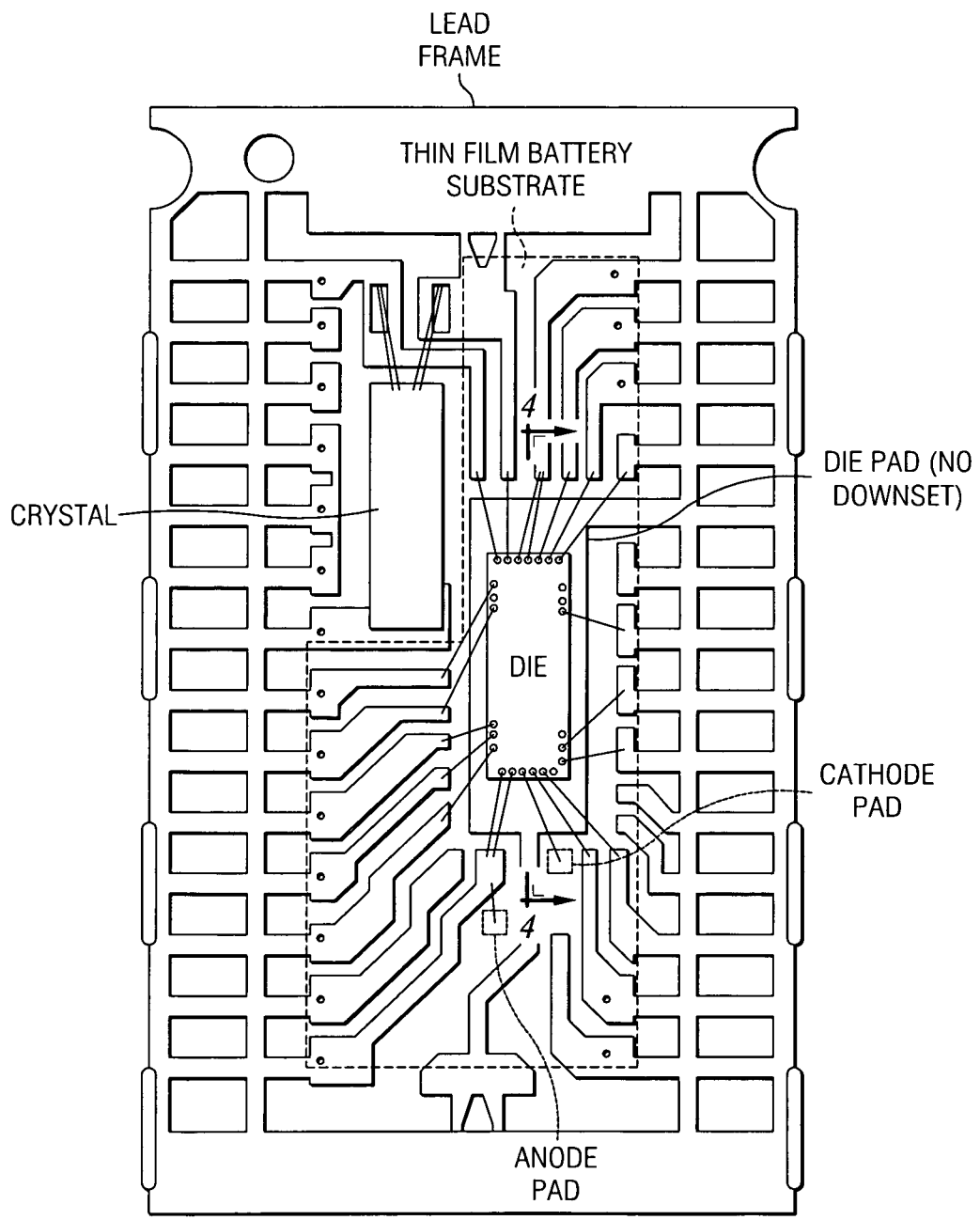
FIG. 3 illustrates exemplary embodiments of the invention wherein an integrated circuit die is electrically connected to a thin-film battery provided on a substrate, before encapsulation.

FIG. 3 illustrates exemplary embodiments of a substrate (shown by broken line) having a thin-film battery fabricated thereon and adhesively attached to the bottom of a lead-frame die pad. The integrated circuit die on the die pad is wire bonded to the anode and cathode pads of the substrate on which the thin-film battery is fabricated.

Figure 1:
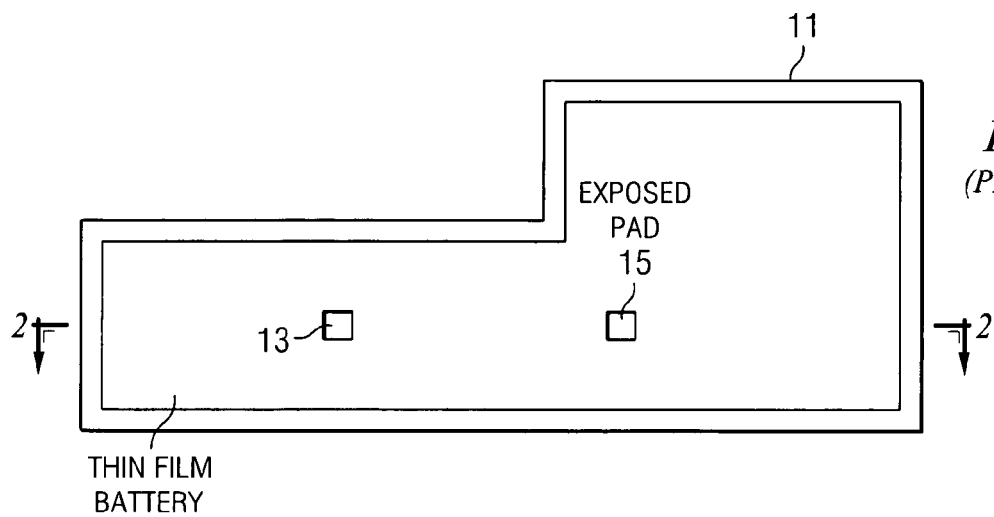
FIG. 1 is a top view of a thin-film battery according to the prior art.
Figure 2:
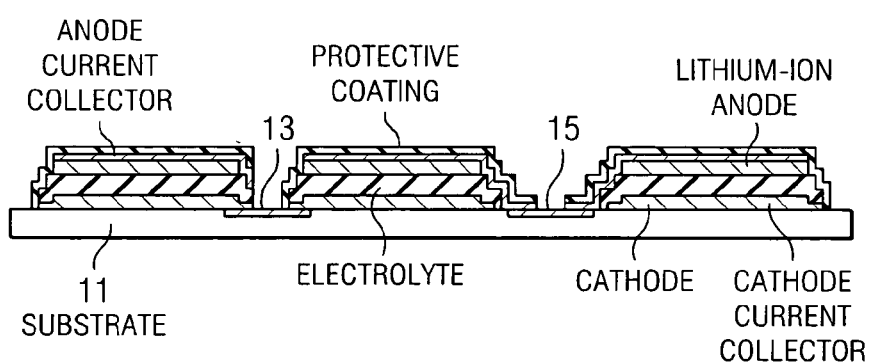
FIG. 2 is a sectional view taken along section line 2-2 of FIG. 1.
Figure 4:
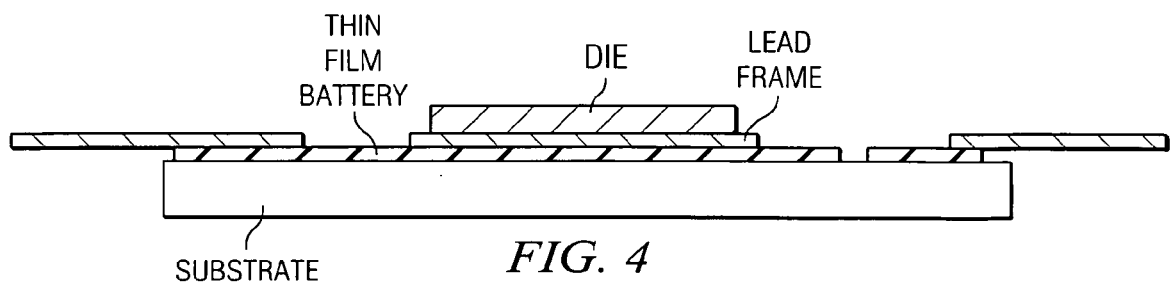
FIG. 4 is a sectional view taken along a portion of line 4-4 of FIG. 3.

FIG. 4 is a cross-sectional view taken along a portion of the section line 4-4 of FIG. 3. As shown in FIG. 4, the thin-film battery, as provided on the substrate, is attached to the bottom of the lead-frame die pad opposite the integrated circuit die.

It will be evident to workers in the art that the anvil blocks of a conventional die attach machine and the heat block/window clamps of a conventional wire bonder can be readily modified to hold the lead-frame of FIG. 3 with the battery-bearing substrate attached thereto.

Figure 5:
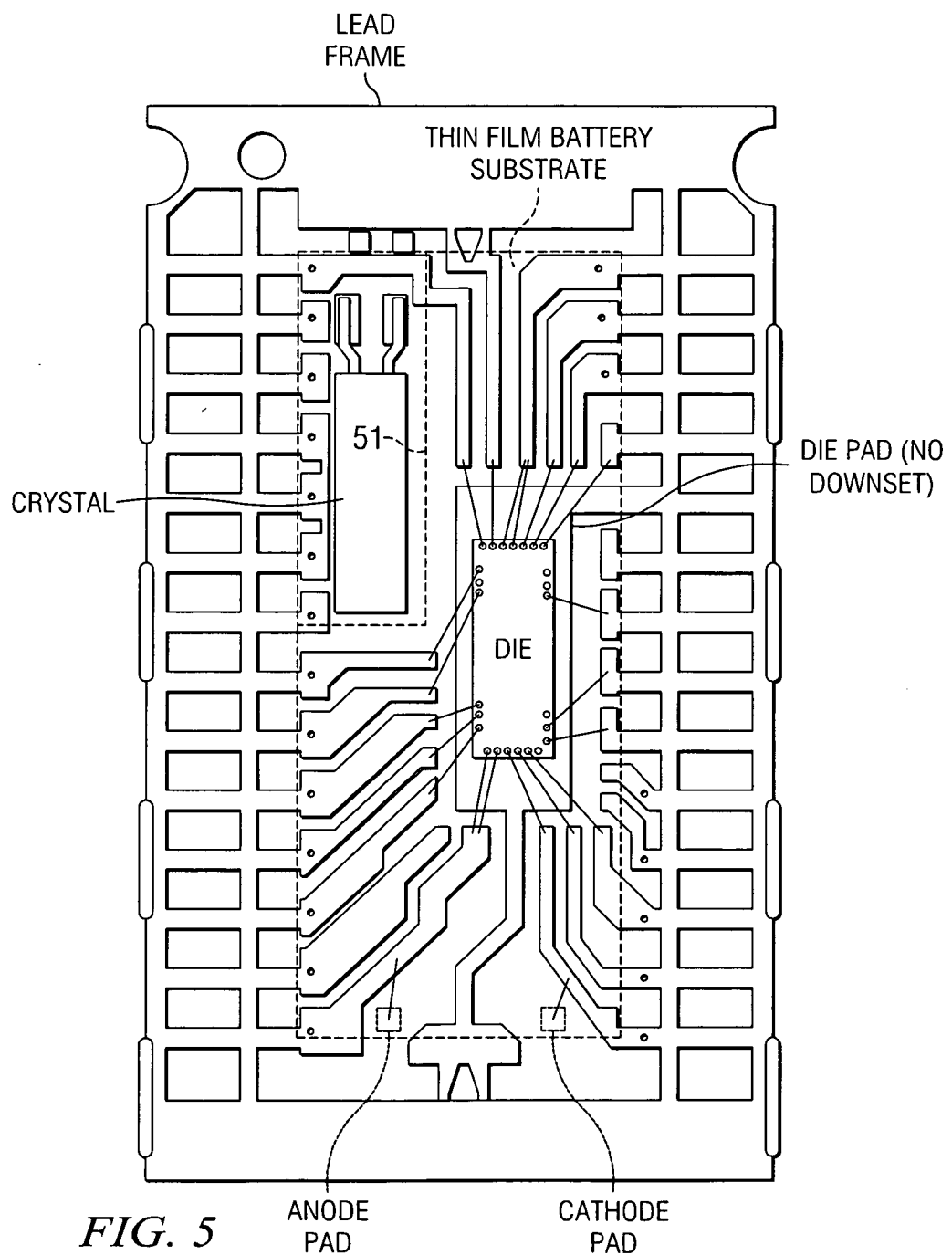
FIG. 5 is similar to FIG. 3, but illustrates exemplary embodiments of the invention wherein a crystal is provided together with a thin-film battery on a substrate, before encapsulation.

In some exemplary embodiments, the battery-bearing substrate of FIG. 3 can also be utilized for mounting a crystal that is encapsulated together with the integrated circuit die and the battery-bearing substrate. In some embodiments, the crystal is recessed into the battery-bearing substrate in order to comply with height limitations on the integrated circuit package. For example, the crystal can be recessed into the substrate by opening up a 0.38-millimeter deep rectangular pocket that measures 1.8 millimeters by 5 millimeters. In other embodiments, the crystal is recessed into the substrate using a drilled-through slot measuring 1.2 millimeters by 5 millimeters. FIG. 5 illustrates a crystal mounted in a generally rectangular recess 51 provided in a battery-bearing substrate (shown by broken line) according to exemplary embodiments of the invention. FIG. 5 shows the anode and cathode pads of the substrate wire bonded to respective lead-frame fingers that are also wired bonded to the integrated circuit die.

Figure 15:
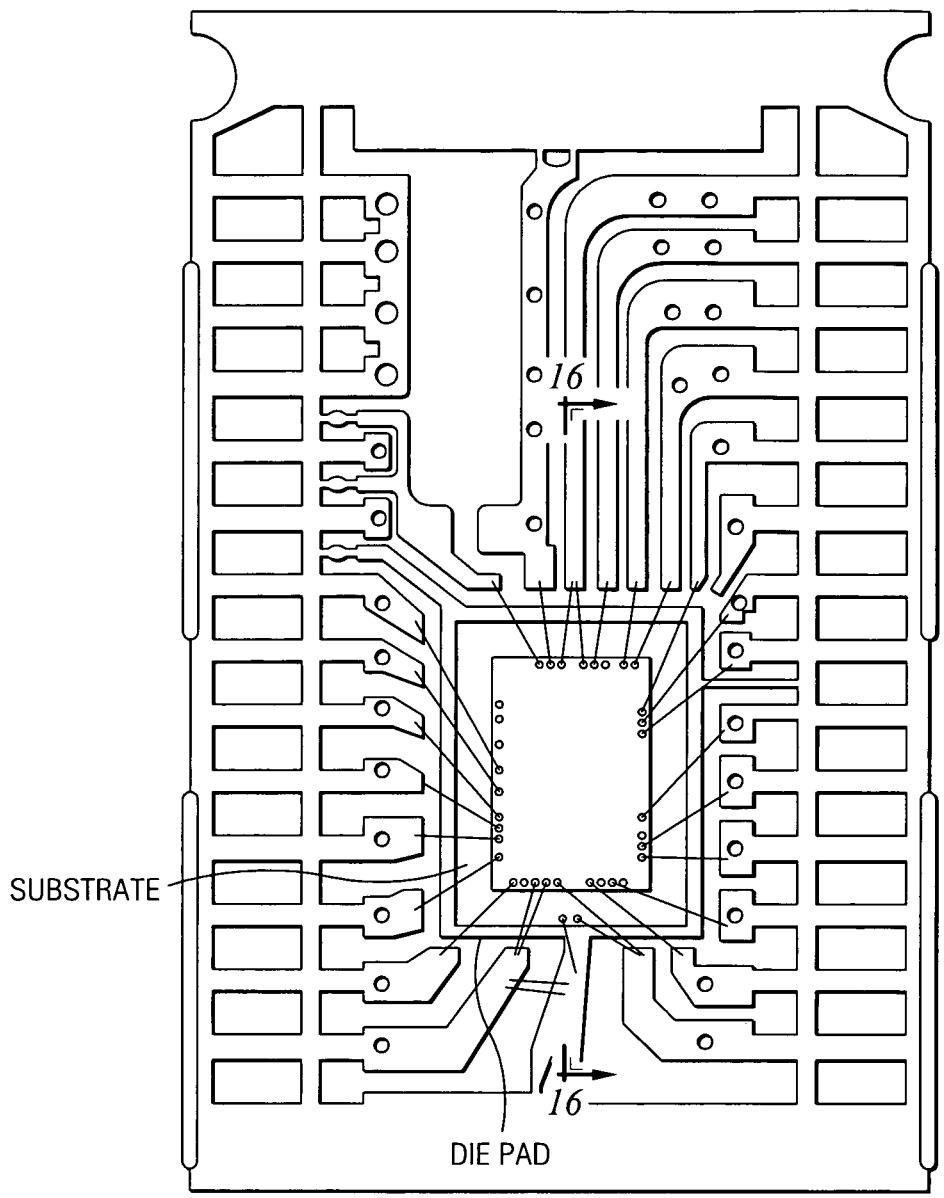
FIG. 15 is similar to FIG. 3, but illustrates exemplary embodiments wherein the substrate is attached to the top of the die pad and the die is stacked on top of the thin-film battery.
Figure 16:
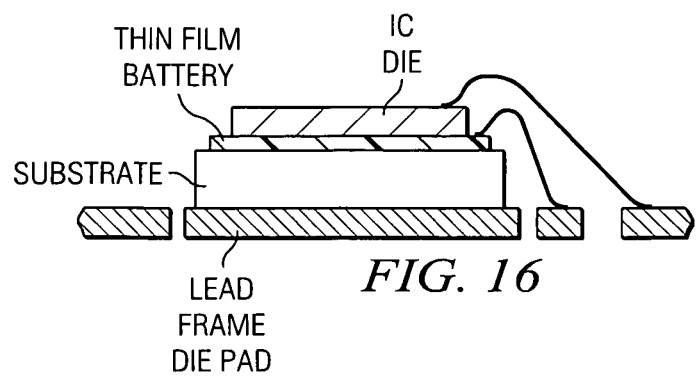
FIG. 16 is a sectional view taken along line 16-16- of FIG. 15.

FIGS. 15 and 16 illustrate further exemplary embodiments, wherein the battery-bearing substrate is attached to the top of the lead-frame die pad, and the integrated circuit die is stacked on top of the battery. As shown in FIGS. 15 and 16, the area of the battery-bearing substrate is larger than the area of the die, so that the anode and cathode pads on the substrate are exposed for wire bonding. Also, the area of the battery-bearing substrate is smaller than the area of the die pad. In some embodiments, the substrate can be FR4, BT or silicon wafer. In some embodiments, a conventional stacked die assembly process is used to produce the arrangement shown in FIGS. 15 and 16.

Figure 6:
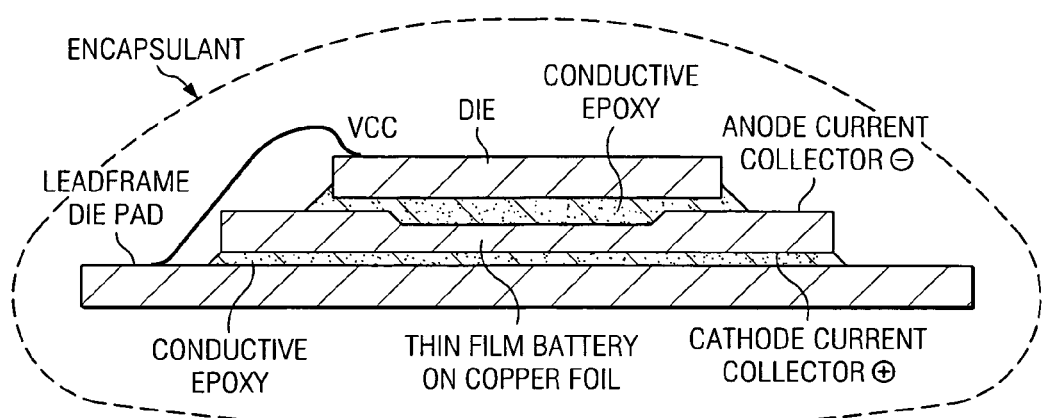
FIG. 6 illustrates exemplary embodiments of the invention wherein an integrated circuit die is electrically connected to a thin-film battery provided on a copper foil substrate.

In some exemplary embodiments of the invention, the substrate on which the battery is fabricated can be a flexible substrate, such a Kapton polyimide film, Zyvex liquid crystalline polymer (LCP) circuit material, or an electrically conductive metal foil such as copper foil. The example of copper foil will be utilized in the following description relative to FIGS. 6-11. In these exemplary embodiments, the thin-film battery is fabricated on the copper foil substrate with the anode and cathode current collectors exposed and electrically accessible on opposite sides of the battery structure. The cathode side of the battery structure is attached to the lead-frame die pad using conductive epoxy, and the integrated circuit die is attached to the anode side of the battery by conductive epoxy. FIG. 6 illustrates exemplary embodiments of this general type. If the backside of the die is grounded, then only a single wire bond from the Vcc pad of the die to the lead-frame die pad is necessary for proper electrical connection of the die to the battery. Because there is no wire bond to the battery-bearing substrate, there is no need to provide bonding pads on the substrate.

Figure 7:
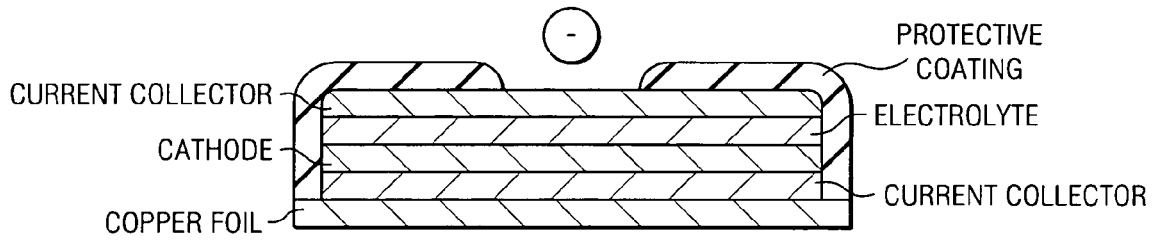
FIG. 7 is a cross-sectional view of exemplary embodiments of the thin-film battery of FIG. 6.
Figure 8:
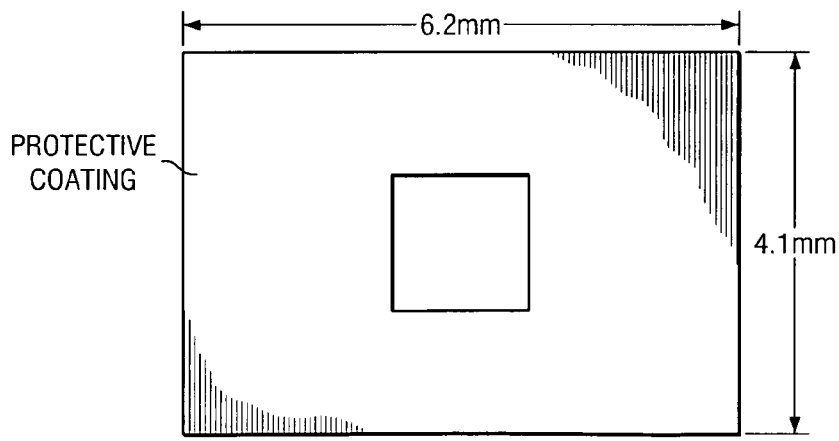
FIG. 8 is a top view of the example of FIG. 7.

FIG. 7 is a cross-sectional view of exemplary embodiments of the battery fabricated on copper foil shown in FIG. 6. FIG. 8 is top view of the example of FIG. 7. In the battery of FIGS. 7 and 8, the protective coating exposes a portion of the anode current collector for electrical connectivity (via the conductive epoxy of FIG. 6) to the backside of the die, and the copper foil permits electrical connectivity from the cathode current collector (via the conductive epoxy of FIG. 6) to the lead-frame die pad.

Figure 9:
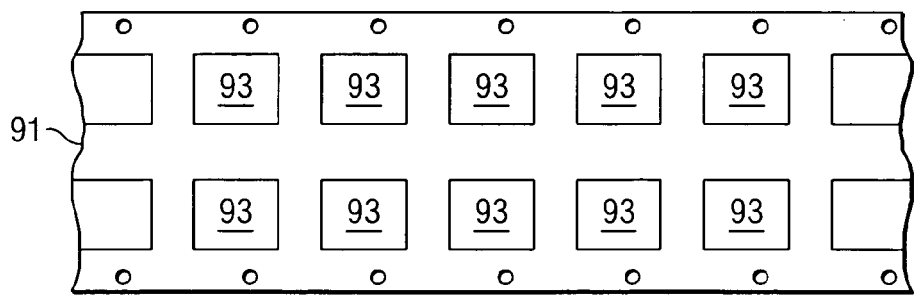
FIG. 9 illustrates a battery reel of copper foil having thin-film batteries fabricated thereon for use in exemplary embodiments of the invention.
Figure 10:
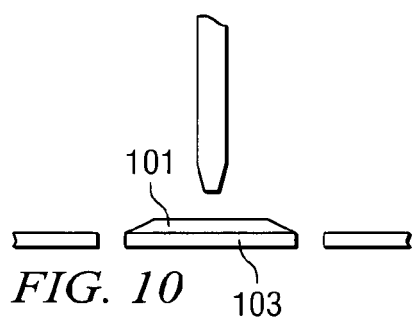
FIG. 10 illustrates the preparation of a die pad to be adhesively bonded to one of the thin-film batteries of FIG. 9.
Figure 11:
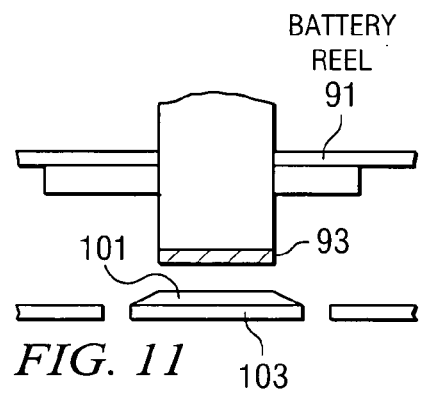
FIG. 11 illustrates the separation of one of the thin-film batteries of FIG. 9 for adhesion to the prepared die pad of FIG. 10.

FIG. 9 illustrates an exemplary copper foil battery reel 91, having fabricated thereon a plurality of thin-film batteries 93 for encapsulation in integrated circuit packages according to exemplary embodiments of the invention. FIG. 10 illustrates application of a conductive adhesive 101 to a lead-frame die pad 103, in order to permit attachment of a battery-bearing copper foil substrate to the lead-frame die pad 103. As shown in FIG. 11, a battery 93 is punched (or cut) out of the battery reel 91 and then attached to the lead-frame die pad 103 via the conductive adhesive 101. In other exemplary embodiments, the adhesive can be applied to the copper foil (see also FIGS. 6 and 7), thereby permitting the battery to be adhesively attached to the lead-frame die pad 103.

After the conductive adhesive 101 cures, a typical conventional lead-frame packaging process can be implemented. The die attach process will attach the backside of the die to the anode side of the battery as discussed above with respect to FIG. 6, the wire bonding process will bond the Vcc pad of the die to the lead-frame die pad, and the entire arrangement (see broken line in FIG. 6) will then be encapsulated.

Figure 12:
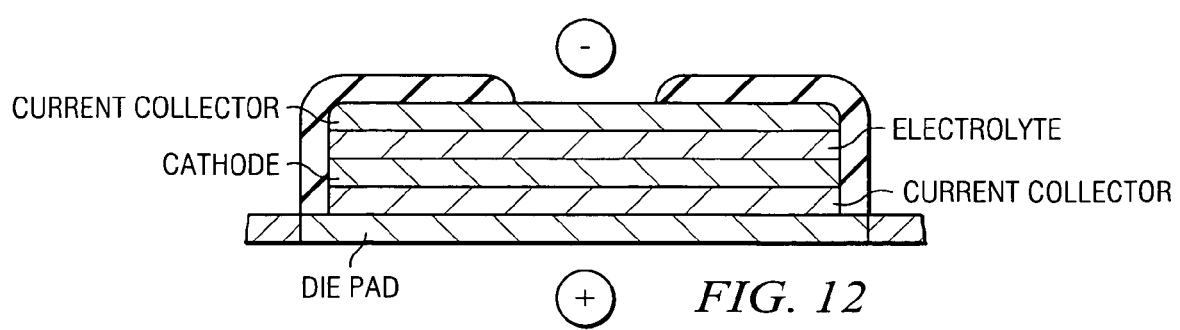
FIG. 12 is similar to FIG. 6, but illustrates exemplary embodiments of the invention wherein a thin-film battery is provided on a lead-frame die pad.

As illustrated in FIG. 12, in some exemplary embodiments, the battery is fabricated directly on the lead-frame die pad, which serves as the substrate. From this point, the backside of the die can be attached to the anode side of the battery of FIG. 12 using conductive epoxy in generally the same manner described above with respect to FIG. 6. With the backside of the die grounded, the Vcc bond pad of the die can be wire bonded to the lead-frame die pad in order to complete the electrical connection between the battery and the die. The battery-bearing lead-frame die pad and the integrated circuit die can then be encapsulated together in generally conventional fashion.

Figure 13:
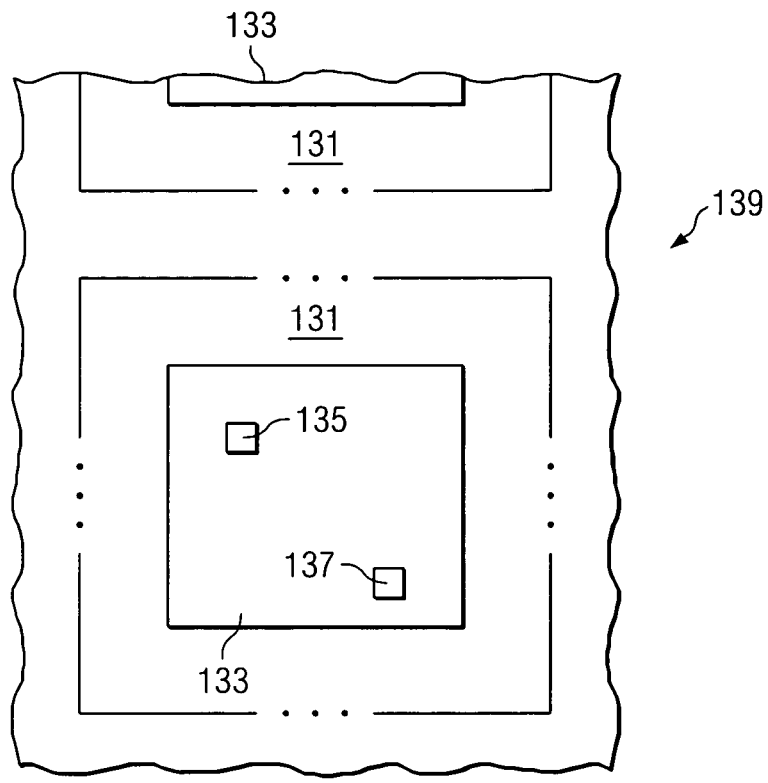
FIG. 13 illustrates exemplary embodiments of the invention wherein a thin-film battery is provided on an unsingulated integrated circuit die on a wafer.

FIG. 13 illustrates further exemplary embodiments according to the invention wherein the substrate on which the thin-film battery is fabricated is an unsingulated die on a wafer 139 that includes a plurality of die. After the die 131 is separated from the wafer 139 and attached to a lead-frame, the anode and cathode contacts 135 and 137 can be wire bonded to the appropriate bond pads of the integrated circuit die prior to encapsulation.

Figure 14:
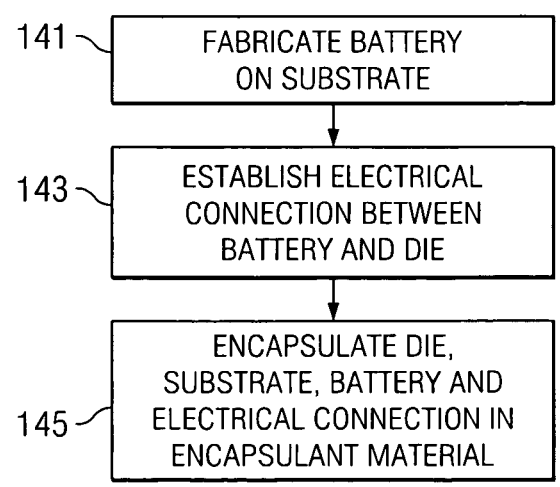
FIG. 14 illustrates exemplary operations which can be utilized to produce integrated circuit packages according to exemplary embodiments of the invention.

FIG. 14 illustrates exemplary operations which can be performed according to the invention to produce the exemplary embodiments described above with respect to FIGS. 3-13. At 141, the thin-film battery is fabricated on a substrate. Thereafter at 143, an electrical connection is established between the battery and the integrated circuit die, thereby enabling the battery to provide power to the integrated circuit die. After the electrical connection is established, the integrated circuit die, the substrate, the battery and the electrical connection are encapsulated together within an encapsulant material.

Although exemplary embodiments of the invention are described above in detail, this does not limit the scope of the invention, which can be practiced in a variety of embodiments.

What is claimed is:
1. An integrated circuit package apparatus, comprising:
a thin-film battery adhered to a first surface of a substrate;
an integrated circuit die overlying at least a portion of the thin-film battery such that the portion of the thin-film battery is interposed between the substrate and the integrated circuit die;
a lead frame adhered to one of a portion of the thin-film battery underlying the integrated circuit die and a second surface of the substrate opposite the first surface, wherein the lead frame is electrically connected to the integrated circuit die;

an electrical connection between the integrated circuit die and the thin-film battery; and a crystal mounted to a surface of the substrate facing the integrated circuit die such that the crystal and the thin-film battery are disposed in separate areas on the substrate, wherein the integrated circuit die, the lead-frame, the substrate, the thin-film battery, the electrical connection and the crystal are encapsulated together within an encapsulant material.

2. The apparatus of claim 1, wherein the thin-film battery is one of a lithium-ion battery and a lithium-free battery.

3. The apparatus of claim 1, wherein the lead-frame includes a die pad, the die pad having a pair of oppositely facing sides, the integrated circuit die attached to one of the sides and the substrate attached to the other of the sides.

4. The apparatus of claim 1, wherein the substrate is a flexible substrate.

5. The apparatus of claim 4, wherein the substrate is an electrically conductive foil substrate.

6. The apparatus of claim 5, wherein the substrate is a copper foil substrate.

7. The apparatus of claim 1, wherein the lead-frame includes a die pad on which the integrated circuit die is supported, and wherein the die pad is the substrate on which the thin-film battery is provided.

8. The apparatus of claim 1, wherein the lead-frame includes a die pad on which the integrated circuit die is supported, the thin-film battery interposed between the die pad and the integrated circuit die.

9. The apparatus of claim 8, wherein the thin-film battery includes an anode electrically connected to a back of the integrated circuit die, and a cathode electrically connected to the die pad, and wherein the die pad is electrically connected to the integrated circuit die.

10. The apparatus of claim 9, wherein the back of the integrated circuit die is grounded, and the die pad is wire bonded to a voltage supply pad of the integrated circuit die.

11. The apparatus of claim 8, wherein the substrate is an electrically conductive foil.

12. The apparatus of claim 11, wherein the substrate is attached to the die pad by an electrically conductive epoxy.

13. The apparatus of claim 11, wherein the substrate is a copper foil substrate.

14. The apparatus of claim 8, wherein the die pad is the substrate.

15. The apparatus of claim 8, wherein the substrate is attached to the die pad and the integrated circuit die is stacked on the thin-film battery.

16. The apparatus of claim 1, wherein the integrated circuit die is the substrate.

17. An integrated circuit package, comprising:
a thin-film battery having an anode and a cathode and adhered to a first surface of a substrate;

an integrated circuit die overlying at least a portion of the thin-film battery such that the portion of the thin-film battery is interposed between the substrate and the integrated circuit die;

a lead frame adhered to one of a portion of the thin-film battery underlying the integrated circuit die and a second surface of the substrate opposite the first surface, wherein the lead frame is electrically connected to the integrated circuit die;

a crystal; and an encapsulant material encapsulating the thin-film battery, the lead-frame, the integrated circuit die and the crystal, wherein the thin-film battery is mounted on the lead-frame in physical contact with the lead-frame, the lead-frame is electrically coupled to one of the anode and cathode, and the integrated circuit die is electrically coupled to the crystal, the lead-frame and the other of the anode and cathode.

18. The integrated circuit package of claim 17, wherein the integrated circuit die is electrically coupled to the thin-film battery by an electrically conductive epoxy.

19. The integrated circuit of claim 18, wherein the integrated circuit die is electrically connected to the lead-frame by a wire bond connection.

20. An integrated circuit package, comprising:
a thin-film battery having first and second surfaces on opposing sides of the thin-film battery and adhered to a first surface of a substrate;

an integrated circuit die overlying at least a portion of the thin-film battery such that the portion of the thin-film battery is interposed between the substrate and the integrated circuit die, wherein the integrated circuit die is electrically coupled to the second surface;

a lead-frame adhered to one of a portion of the thin-film battery underlying the integrated circuit die and a second surface of the substrate opposite the first surface such that the portion of the thin-film battery, the integrated circuit die and a portion of the lead-frame are in stacked alignment, wherein the lead frame is electrically coupled to the first surface;

a crystal electrically coupled to the integrated circuit; and an encapsulant material encapsulating the thin-film battery, the lead-frame, the integrated circuit die and the crystal.

21. The integrated circuit of claim 20, wherein the substrate is an electrically conductive foil.

22. The integrated circuit of claim 21, wherein the lead-frame is electrically coupled to the substrate by an electrically conductive epoxy.

23. The integrated circuit of claim 22, wherein the integrated circuit die is electrically coupled to the second surface by an electrically conductive epoxy.

24. The apparatus of claim 1, wherein the thin-film battery is less than fifteen micrometers thick, wherein the thin-film battery is fabricated on the substrate, and wherein the substrate does not comprise bonding pads.

* * * * *

UNITED STATES PATENT AND TRADEMARK OFFICE
CERTIFICATE OF CORRECTION

| | | |
|---|---|---|
| PATENT NO. | : 8,766,435 B2 | Page 1 of 1 |
| APPLICATION NO. | : 10/880757 | |
| DATED | : July 1, 2014 | |
| INVENTOR(S) | : Hundt et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1613 days.

Signed and Sealed this
Twelfth Day of April, 2016

Michelle K. Lee
*Director of the United States Patent and Trademark Office*